(12) United States Patent
Wang et al.

(10) Patent No.: US 10,833,196 B2
(45) Date of Patent: *Nov. 10, 2020

(54) FINFET STRUCTURES AND METHODS OF FORMING THE SAME

(71) Applicant: Taiwan Semiconductor Manufacturing Company, Ltd., Hsinchu (TW)

(72) Inventors: Yu-Sheng Wang, Tainan (TW); Chi-Cheng Hung, Tainan (TW); Chia-Ching Lee, New Taipei (TW); Chung-Chiang Wu, Taichung (TW); Ching-Hwanq Su, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/675,306

(22) Filed: Nov. 6, 2019

(65) Prior Publication Data

US 2020/0075765 A1 Mar. 5, 2020

Related U.S. Application Data

(62) Division of application No. 15/474,187, filed on Mar. 30, 2017, now Pat. No. 10,497,811.

(60) Provisional application No. 62/434,972, filed on Dec. 15, 2016.

(51) Int. Cl.
*H01L 29/78* (2006.01)
*H01L 29/66* (2006.01)
*H01L 29/49* (2006.01)
*H01L 29/51* (2006.01)

(52) U.S. Cl.
CPC ...... *H01L 29/7851* (2013.01); *H01L 29/4966* (2013.01); *H01L 29/66545* (2013.01); *H01L 29/66795* (2013.01); *H01L 29/513* (2013.01); *H01L 29/517* (2013.01); *H01L 29/665* (2013.01)

(58) Field of Classification Search
None
See application file for complete search history.

(56) References Cited

U.S. PATENT DOCUMENTS

| | | |
|---|---|---|
| 6,376,349 B1 | 4/2002 | Tobin et al. |
| 8,772,109 B2 | 7/2014 | Colinge |
| 8,785,285 B2 | 7/2014 | Tsai et al. |

(Continued)

FOREIGN PATENT DOCUMENTS

| | | |
|---|---|---|
| KR | 100830590 B1 | 5/2008 |
| KR | 20080100527 A | 11/2008 |

*Primary Examiner* — Benjamin P Sandvik
(74) *Attorney, Agent, or Firm* — Slater Matsil, LLP

(57) ABSTRACT

A method includes forming a first semiconductor fin protruding from a substrate and forming a gate stack over the first semiconductor fin. Forming the gate stack includes depositing a gate dielectric layer over the first semiconductor fin, depositing a first seed layer over the gate dielectric layer, depositing a second seed layer over the first seed layer, wherein the second seed layer has a different structure than the first seed layer, and depositing a conductive layer over the second seed layer, wherein the first seed layer, the second seed layer, and the conductive layer include the same conductive material. The method also includes forming source and drain regions adjacent the gate stack.

20 Claims, 19 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,935,173 B1 | 4/2018 | Wu et al. |
| 10,269,569 B2 * | 4/2019 | Tsai ................. H01L 29/66545 |
| 2002/0197859 A1 | 12/2002 | Kim et al. |
| 2008/0296660 A1 | 12/2008 | Park et al. |
| 2013/0154012 A1 * | 6/2013 | Fu .................... H01L 21/28088 257/368 |
| 2013/0270702 A1 | 10/2013 | Yu et al. |
| 2014/0327141 A1 | 11/2014 | Yu et al. |
| 2015/0061042 A1 | 3/2015 | Cheng et al. |
| 2015/0171177 A1 | 6/2015 | Cheng et al. |
| 2015/0270177 A1 | 9/2015 | Tseng et al. |
| 2015/0325575 A1 | 11/2015 | Park et al. |
| 2015/0348840 A1 | 12/2015 | Bamnolker et al. |
| 2016/0071944 A1 | 3/2016 | Lu et al. |
| 2018/0211922 A1 | 7/2018 | Kim et al. |

\* cited by examiner

FINFET STRUCTURES AND METHODS OF FORMING THE SAME

PRIORITY CLAIM AND CROSS-REFERENCE

This application is a divisional of U.S. patent application Ser. No. 15/474,187, file on Mar. 30, 2017, entitled "FinFET Structures and Methods of Forming the Same," which claims the benefit of U.S. Provisional Application No. 62/434,972, filed on Dec. 15, 2016, which application is hereby incorporated herein by reference.

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
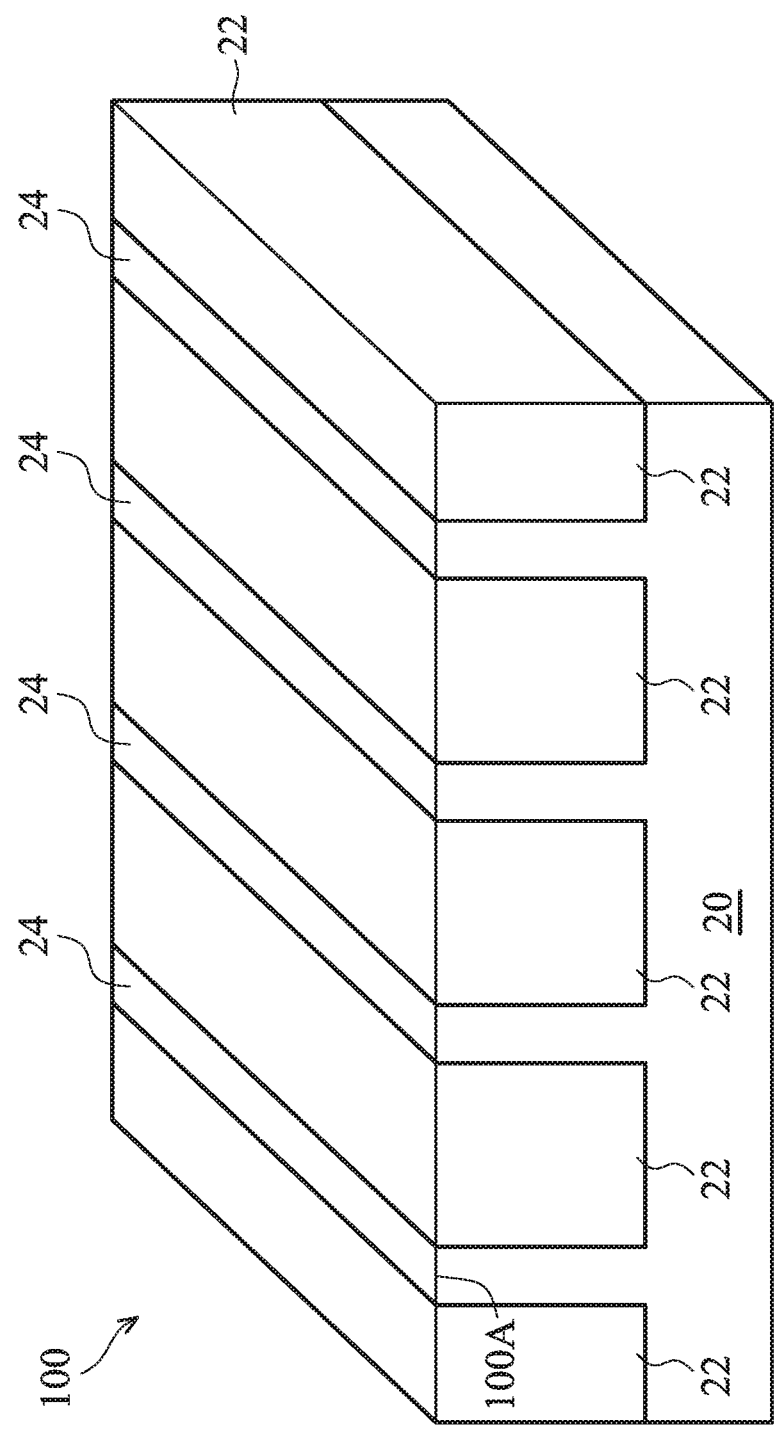
FIGS. 1 through 18 illustrate the cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. The intermediate stages of forming the FinFETs are illustrated in accordance with some embodiments. In particular, methods are described herein of forming a multi-layer seed layer as part of the formation of a gate stack. The multi-layer seed layer may contain a crystalline layer and an amorphous layer. One of ordinary skill in the art will readily understand other modifications that may be made are contemplated within the scope of other embodiments. Although method embodiments are discussed in a particular order, various other method embodiments may be performed in any logical order and may include fewer or more steps than described herein. Throughout the various views and illustrative embodiments, like reference numbers are used to designate like elements. In the illustrated exemplary embodiments, the formation of a FinFET is used an example to explain the embodiments of the present disclosure. Planar transistors may also adopt the concept of the present disclosure.

FIG. 1 illustrates a perspective view of an initial structure. The initial structure includes wafer 100, which further includes substrate 20. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as a multi-layered or gradient substrate may also be used. In some embodiments, the semiconductor material of the substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Isolation regions 22 such as Shallow Trench Isolation (STI) regions may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 24. The top surfaces of semiconductor strips 24 and the top surfaces of STI regions 22 may be substantially level with each other in some embodiments.

STI regions 22 may be an oxide, such as silicon oxide, a nitride, the like, or a combination thereof. STI regions 22 may be formed by a high density plasma chemical vapor deposition (HDP-CVD), a flowable CVD (FCVD) (e.g., a CVD-based material deposition in a remote plasma system and post-curing to convert it to another material, such as an oxide), a spin-on process, a conformal oxide process, the like, or a combination thereof. In other embodiments, other insulation materials formed by any acceptable process may be used. STI regions 22 may include a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed of Flowable Chemical Vapor Deposition (FCVD), spin-on, or the like.

Figure 2:
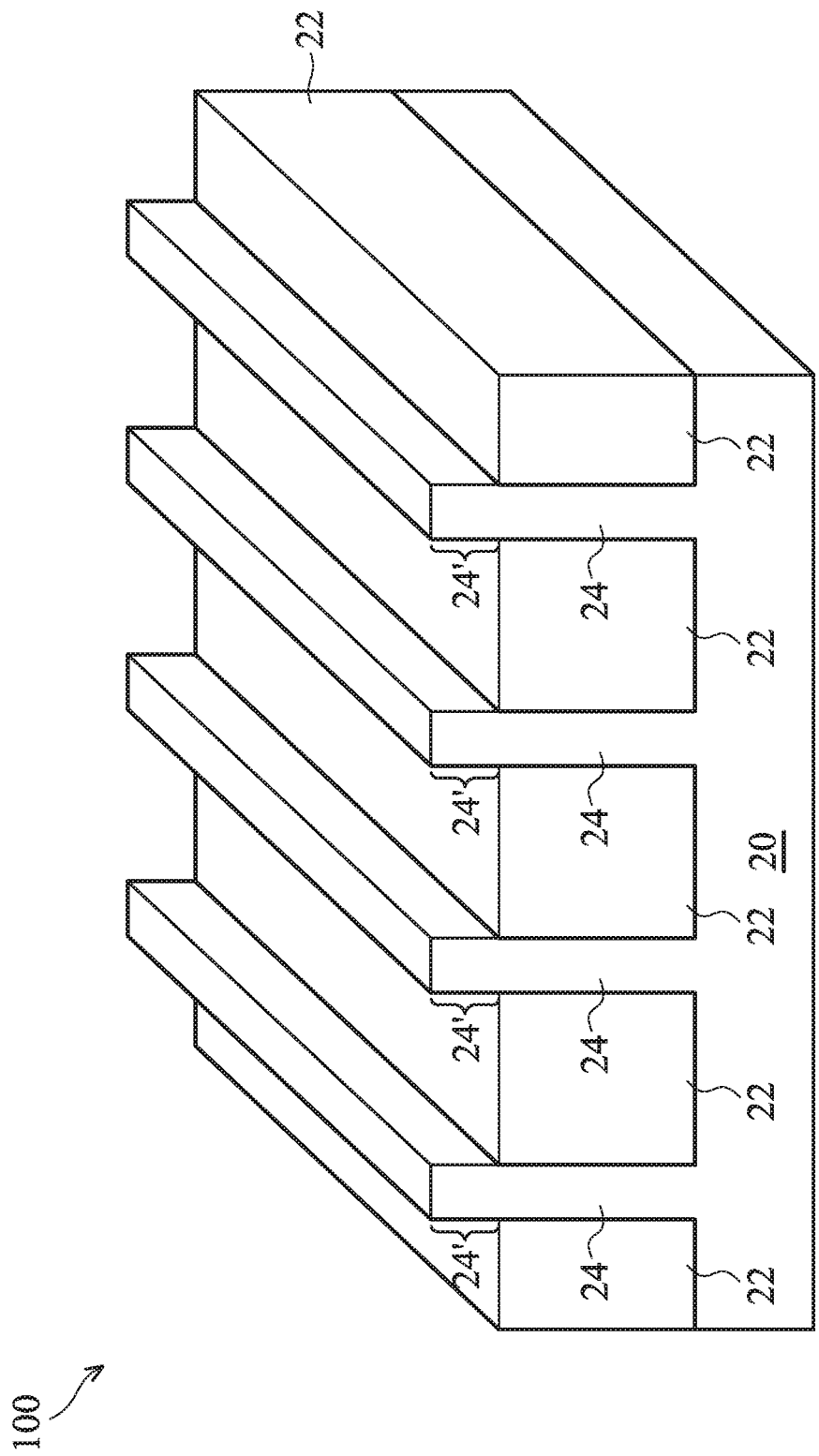

Referring to FIG. 2, STI regions 22 are recessed, so that top portions of semiconductor strips 24 protrude higher than the top surfaces of STI regions 22 to form protruding fins 24'. The etching may be performed using a dry etching process, wherein HF3 and NH3 are used as the etching gases. During the etching process, plasma may be generated. Argon may also be included. In accordance with alternative embodiments of the present disclosure, the recessing of STI regions 22 is performed using a wet etch process. The etching chemical may include diluted HF, for example.

The process described with respect to FIGS. 1 and 2 is just one example of how the semiconductor strips 24 and protruding fins 24' may be formed. In some embodiments, a dielectric layer can be formed over a top surface of the substrate 20; trenches can be etched through the dielectric layer; homoepitaxial structures can be epitaxially grown in the trenches; and the dielectric layer can be recessed such that the homoepitaxial structures protrude from the dielectric layer to form protruding fins. In some embodiments, heteroepitaxial structures can be used for the semiconductor strips 24. For example, the semiconductor strips 24 in FIG. 1 can be recessed, and a material different from the semiconductor strips 24 may be epitaxially grown in their place.

Figure 3:
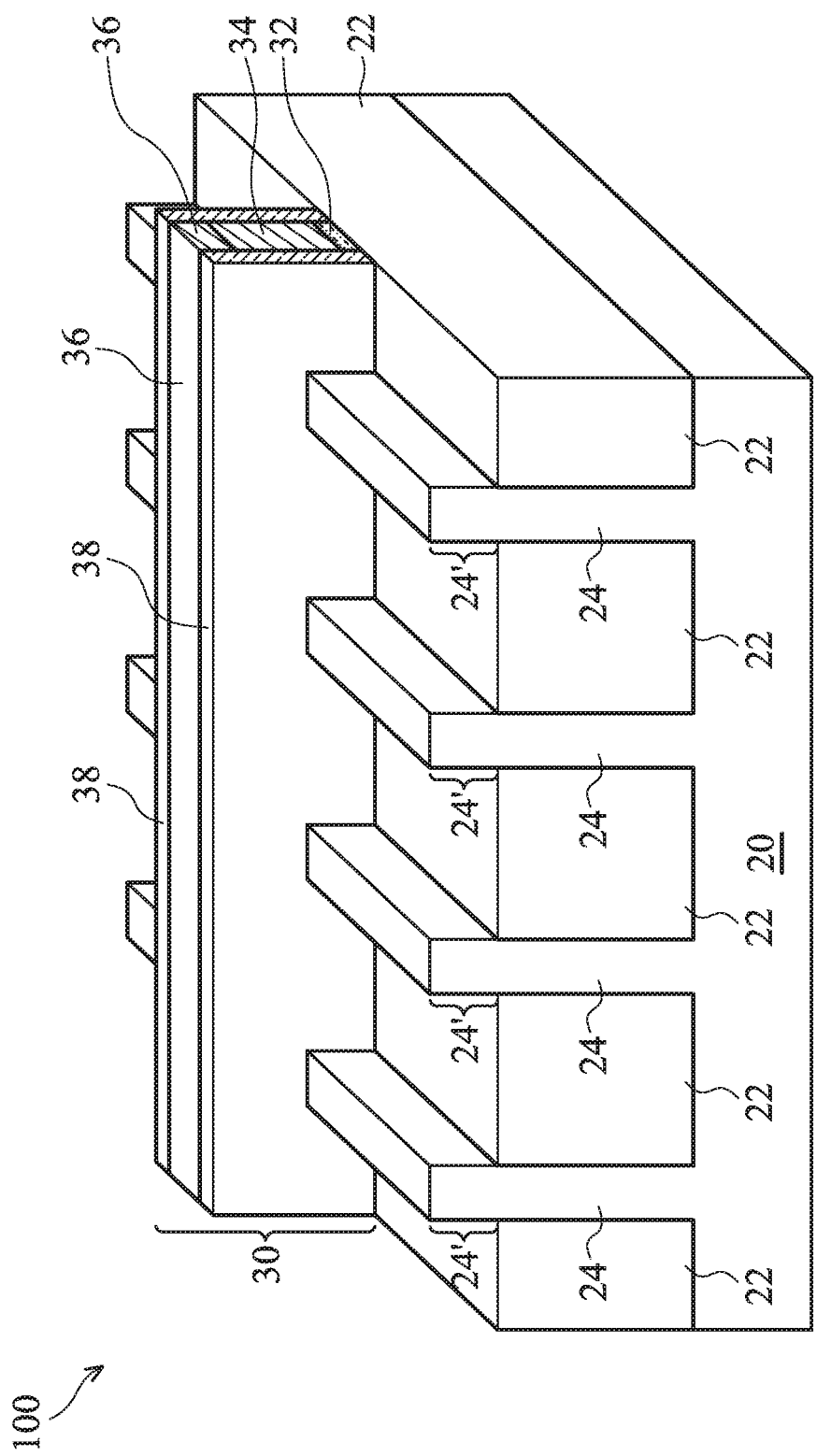

Referring to FIG. 3, dummy gate stack 30 is formed on the top surfaces and the sidewalls of protruding fins 24'. Dummy gate stack 30 may include gate dielectric 32 and dummy gate electrode 34 over dummy gate dielectric 32. The dummy gate dielectric 32 may be, for example, silicon oxide, silicon nitride, a combination thereof, or the like, and may be deposited or thermally grown according to acceptable techniques. Dummy gate electrode 34 may be a conductive material, such as polycrystalline-silicon (polysilicon), polycrystalline silicon-germanium (poly-SiGe), metallic nitrides, metallic silicides, metallic oxides, metals, or the like. In one embodiment, amorphous silicon is deposited and recrystallized to create polysilicon. Dummy gate electrode 34 may be deposited by physical vapor deposition (PVD), CVD, sputter deposition, or other techniques known and used in the art for depositing conductive materials. Dummy gate electrode 34 may be made of other materials that have a high etching selectivity from the etching of isolation regions. In some cases, dummy gate electrode 34 may be deposited over the dummy gate dielectric 32 and then planarized, such as by a CMP. Dummy gate stack 30 may also include one (or a plurality of) hard mask layer 36 over dummy gate electrode 34. Hard mask layer 36 may be formed of silicon nitride (SiN), silicon oxynitride (SiON), silicon carbon nitride (SiCN), or the like. Dummy gate stack 30 may cross over a single one or a plurality of protruding fins 24' and/or STI regions 22. Dummy gate stack 30 may also have a lengthwise direction substantially perpendicular to the lengthwise direction of protruding fins 24'.

Next, gate spacers 38 are formed on the sidewalls of dummy gate stack 30. In accordance with some embodiments of the present disclosure, gate spacers 38 are formed of a dielectric material such as silicon carbon oxynitride (SiCN), silicon nitride, or the like, and may have a single-layer structure or a multi-layer structure including a plurality of dielectric layers.

Figure 4:
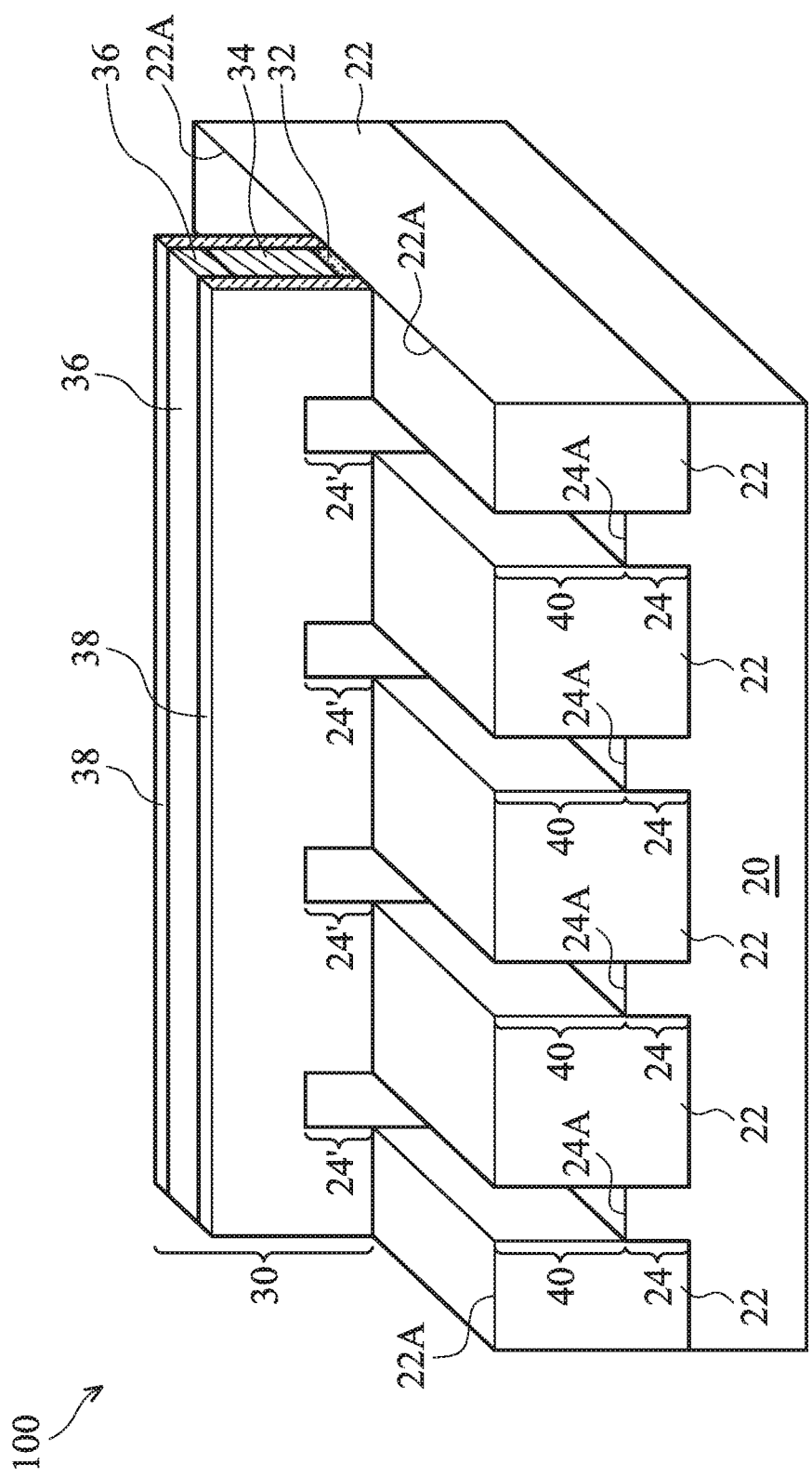

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stack 30 and gate spacers 38 are protected, and are not etched. The top surfaces 24A of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stack 30.

Figure 5:
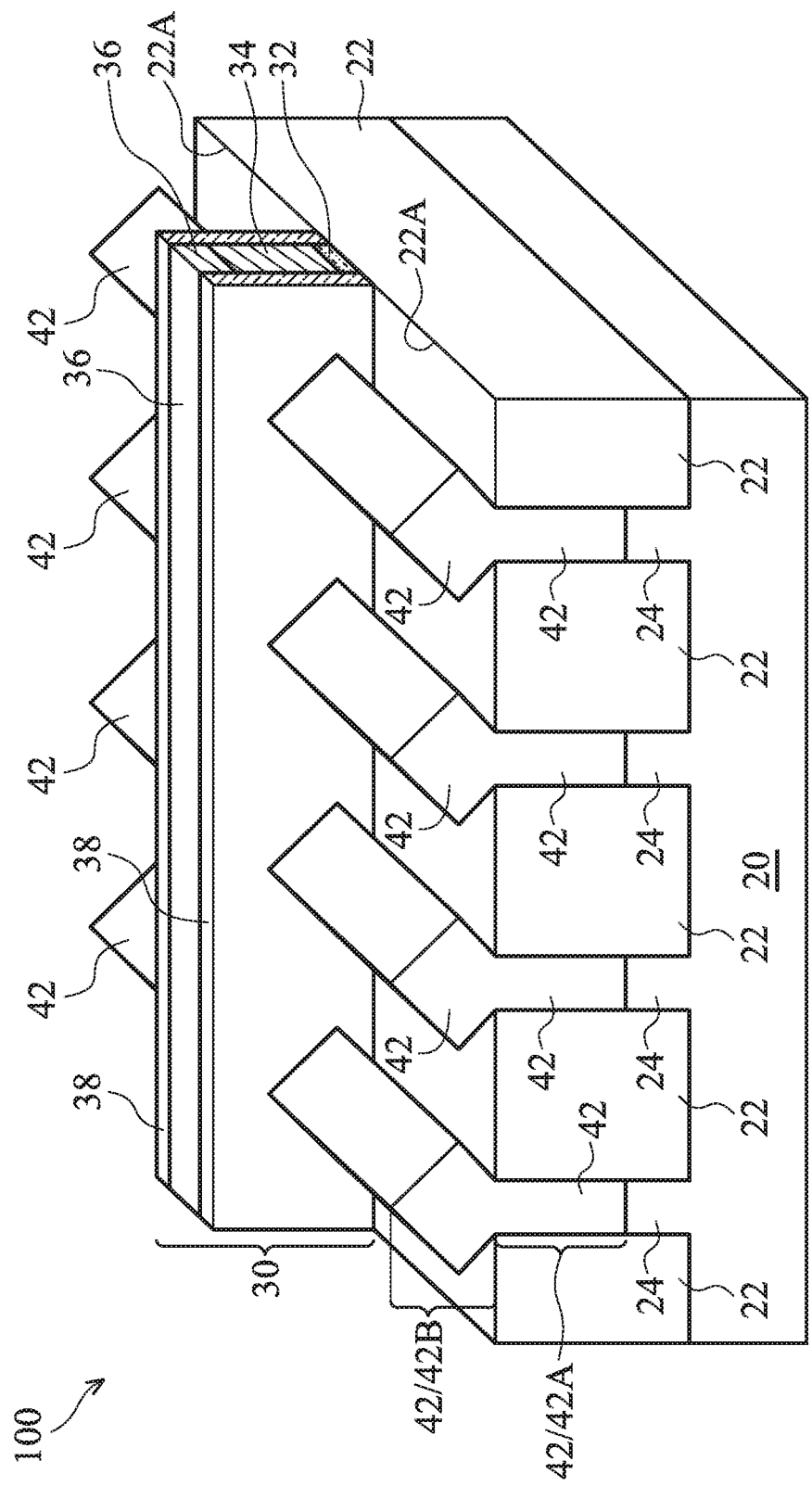

Next, epitaxy regions 42 (source/drain regions) are formed by selectively growing a semiconductor material in recesses 40, resulting in the structure in FIG. 5. In some embodiments, some adjacent epitaxy regions 42 may grow together to form a merged epitaxial structure. In some embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, epitaxy regions 42 may include SiGe, SiGeB, Ge, GeSn, or the like. In some cases, epitaxy regions 42 of an n-type FinFET may include silicon, SiC, SiCP, SiP, or the like. In accordance with alternative embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After recesses 40 are filled with epitaxy regions 42, the further epitaxial growth of epitaxy regions 42 causes epitaxy regions 42 to expand horizontally and facets may be formed.

After the epitaxy step, epitaxy regions 42 may be further implanted with a p-type or an n-type impurity to form source and drain regions, which are also denoted using reference numeral 30. In accordance with alternative embodiments of the present disclosure, the implantation step is skipped since epitaxy regions 42 are in-situ doped with the p-type or n-type impurity during the epitaxy. Epitaxy regions 42 include lower portions 42A that are formed in STI regions 22 and upper portions 42B that are formed over the top surfaces 22A of STI regions 22. Lower portions 42A, whose sidewalls are shaped by the shapes of recesses 40 (FIG. 4), may have (substantially) straight edges, which may also be substantial vertical edges that are substantial perpendicular to the major surfaces (such as bottom surface 20B) of substrate 20.

Figure 6:
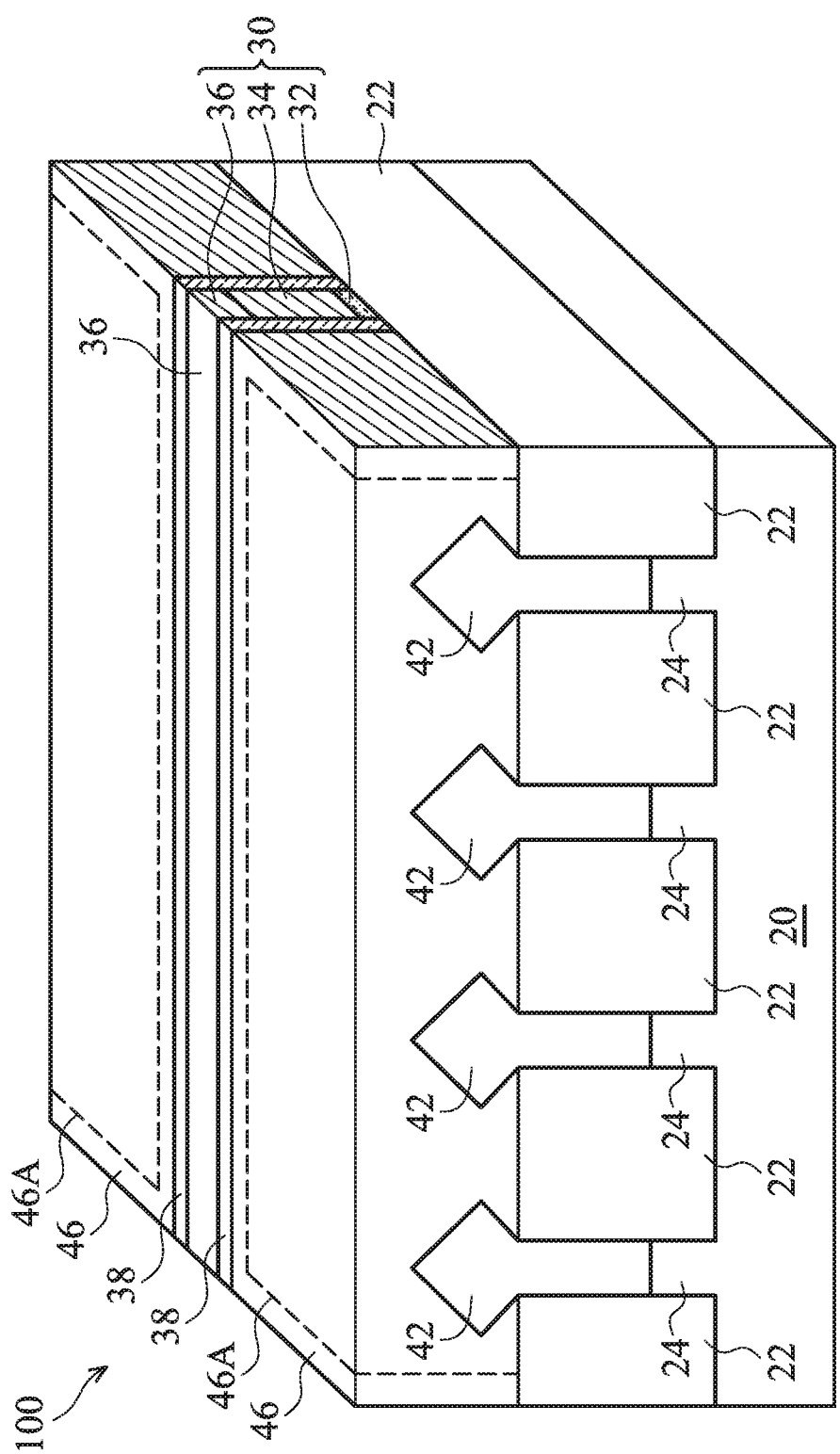

FIG. 6 illustrates a perspective view of the structure after Inter-Layer Dielectric (ILD) 46 is formed. In accordance with some embodiments of the present disclosure, a buffer oxide layer (not shown) and a Contact Etch Stop Layer (CESL, not shown) are formed on source and drain regions 42 before the formation of ILD 46. The buffer oxide layer may be formed of silicon oxide, and the CESL may be formed of silicon nitride, silicon carbo-nitride, or the like. The buffer oxide layer and the CESL may be formed using a conformal deposition method such as Atomic Layer Deposition (ALD), for example. ILD 46 may include a dielectric material formed using, for example, FCVD, spin-on coating, CVD, plasma-enhanced CVD (PECVD), or other deposition methods. ILD 46 may also be formed of Phospho-Silicate glass (PSG), Boro-Silicate Glass (BSG), Boron-Doped Phospho-Silicate Glass (BPSG), undoped Silicate Glass (USG), Tetra Ethyl Ortho Silicate (TEOS) oxide, or the like. A Chemical Mechanical Polish (CMP) may be performed to level the top surfaces of ILD 46, dummy gate stack 30, and gate spacers 38 with each other.

In a subsequent step, portions 46A of ILD 46 are removed to form contact openings. Source/drain silicide regions 48 (FIG. 7A) are then formed on the surfaces of epitaxy regions 42. The formation process includes depositing a metal layer into the contact openings, and performing an anneal to react the metal layer with the exposed surface portions of epitaxy regions 42, so that silicide regions 48 are formed. In accordance with some embodiments, unreacted portions of the metal layer are removed. In accordance with alternative embodiments, the unreacted portions of the metal layer remain unremoved. A conductive material such as tungsten is then filled into the contact openings to form contact plugs 50, as shown in FIG. 7A.

Figure 7A:
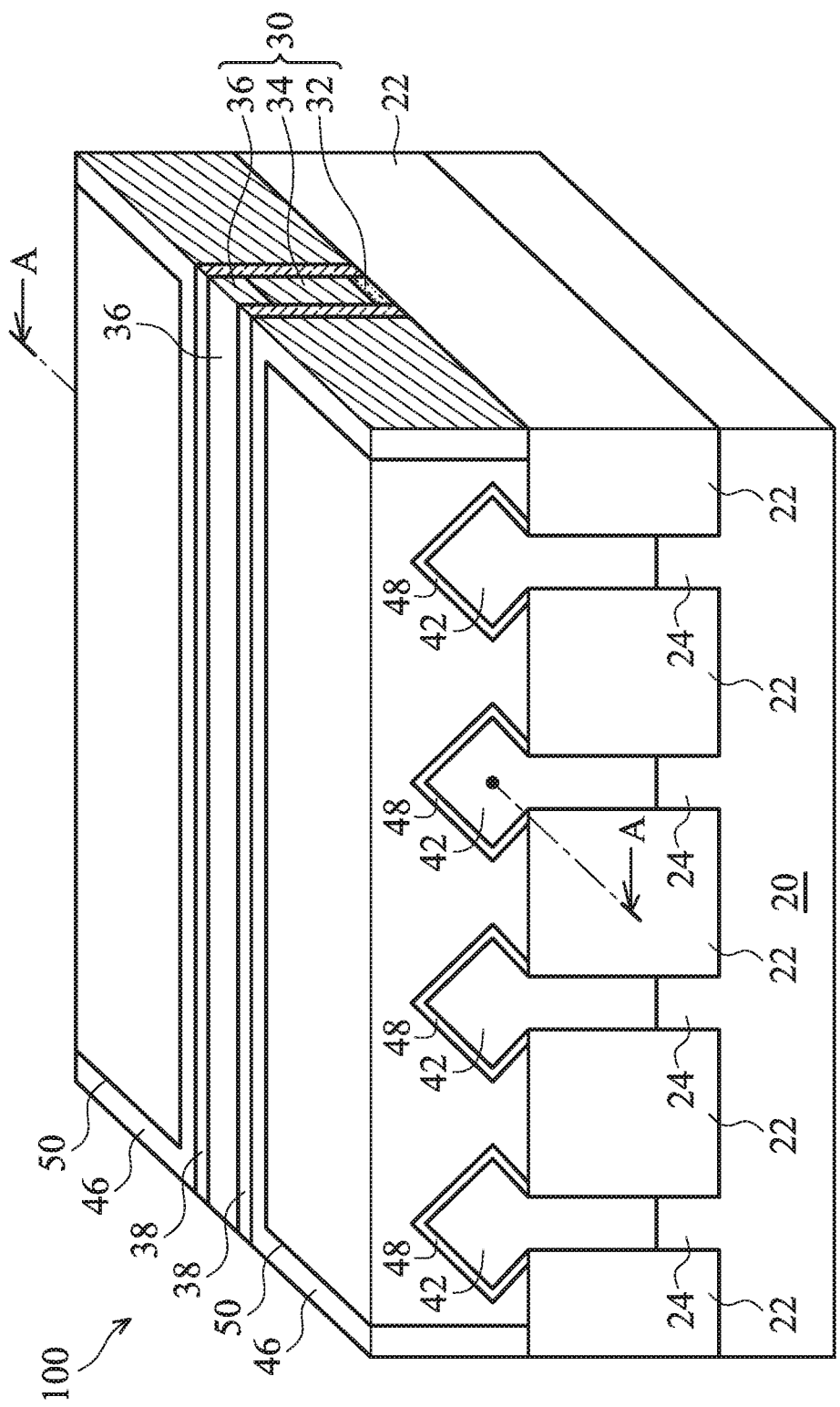
Figure 7B:
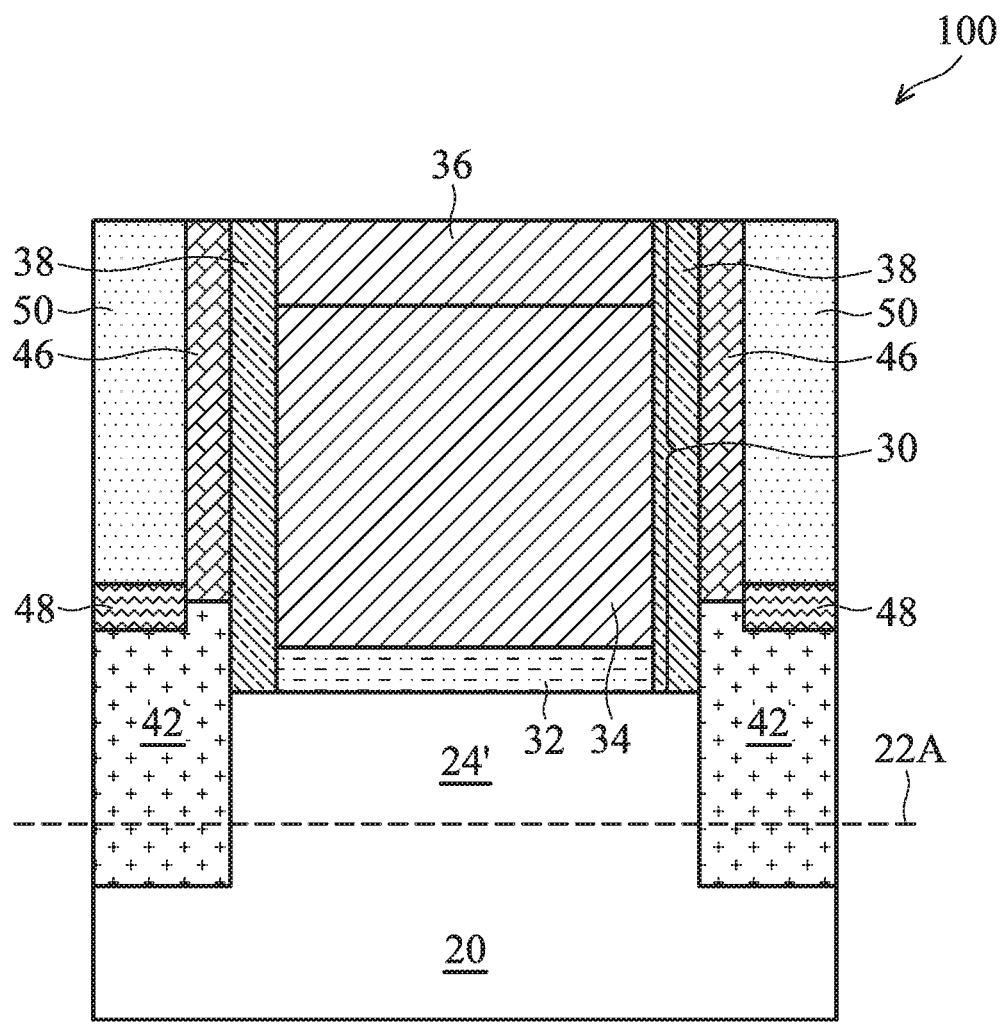

A cross-sectional view of the structure shown in FIG. 7A is illustrated in FIG. 7B, wherein the cross-sectional view is obtained from the vertical plane containing line A-A in FIG. 7A. Next, the dummy gate stack 30 including hard mask layer 36, dummy gate electrode 34 and dummy gate dielectric 32 are replaced with a metal gate and a replacement gate dielectric, as shown in FIGS. 8 through 18. The cross-sectional views shown in FIGS. 8 through 18 are obtained from the same vertical plane containing line A-A in FIG. 7. In FIGS. 8 through 18, the top surfaces 22A of STI regions 22 are illustrated as a dotted line for reference, and semiconductor fins 24' in the channel region extend above the top surfaces 22A.

Figure 8:
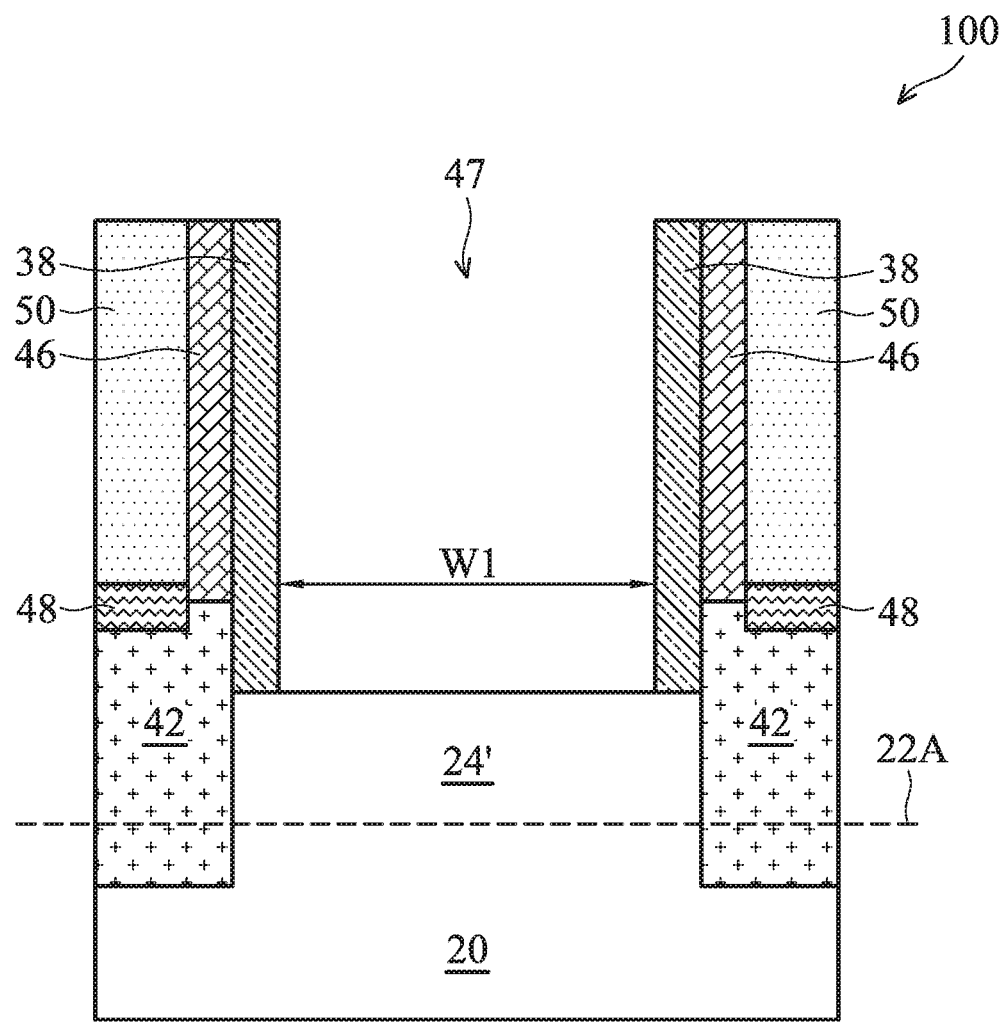

Hard mask layer 36, dummy gate electrode 34, and dummy gate dielectric 32 of dummy gate stack 30 as shown in FIGS. 7A and 7B are then removed, forming opening 47 as shown in FIG. 8. The top surfaces and the sidewalls of protruding fins 24' are exposed to opening 47. In some embodiments, dummy gate stack 30 is removed by an anisotropic dry etch process. For example, the etching process may include a dry etch process using reaction gas(es) that selectively etch dummy gate stack 30 without etching the ILD 46 or the gate spacers 38. In some cases, dummy gate dielectric 32 may be used as an etch stop layer when dummy gate electrode 34 is etched.

Figure 9:
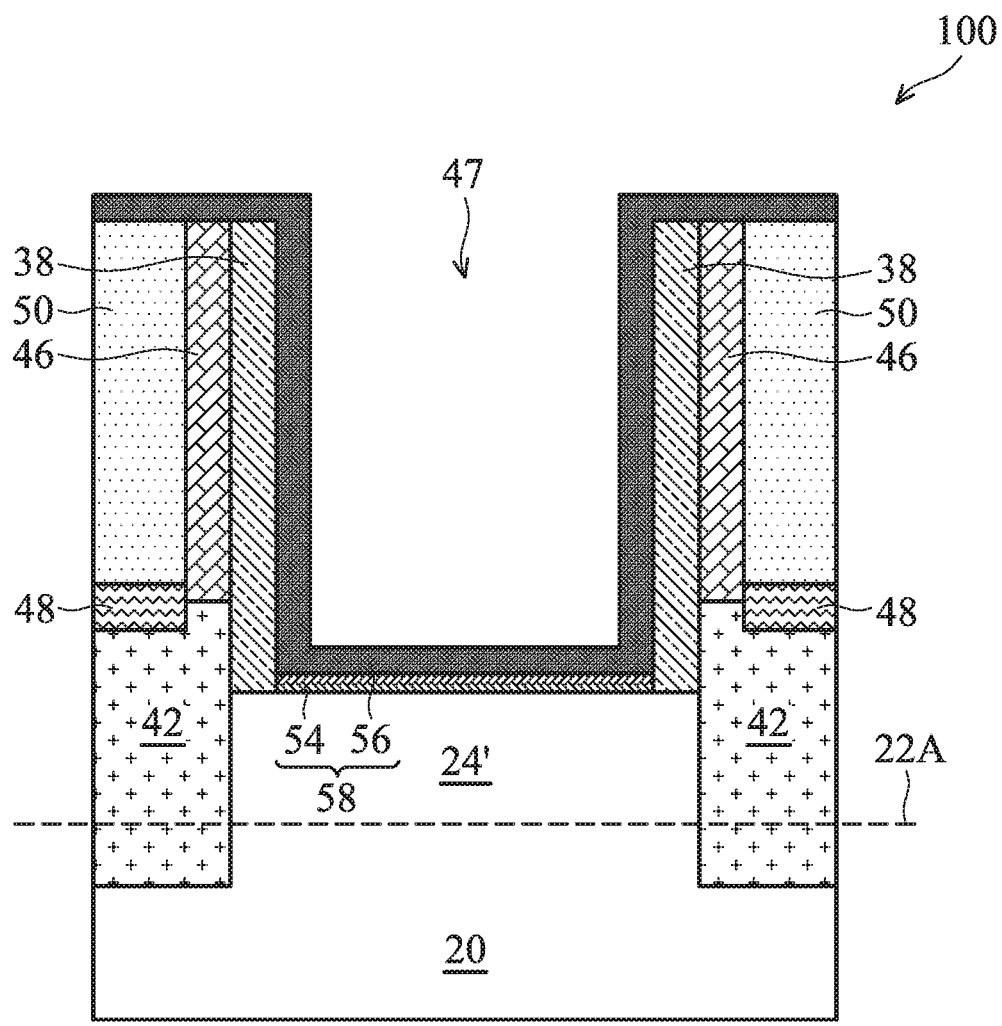

Next, referring to FIG. 9, gate dielectric 58 is formed which extends into opening 47. In some embodiments, gate dielectric 58 includes more than one dielectric layers. As an example, gate dielectric 58 shown in FIG. 9 to FIG. 18 includes Interfacial Layer (IL) 54 as a lower part. IL 54 is formed on the exposed surfaces of protruding fins 24'. IL 54 may include an oxide layer such as a silicon oxide layer, which may be formed through the thermal oxidation of protruding fins 24', a chemical oxidation process, or a deposition process. In some cases, IL 54 may include a silicon nitride layer, and in some cases IL 54 may include one or more layers of silicon oxide, silicon nitride, or another material. Gate dielectric 58 may also include high-k dielectric layer 56 formed over IL 54. High-k dielectric layer 56 may include a metal oxide or a silicate of Hf, Al, Zr, La, Mg, Ba, Ti, Pb, or combinations thereof. The dielectric constant (k-value) of the high-k dielectric material is higher than 3.9, and may be higher than about 7.0, and in some cases may be as high as 21.0 or higher. High-k dielectric layer 56 is overlying, and may contact, IL 54. High-k dielectric layer 56 is formed as a conformal layer, and extends on the sidewalls of protruding fins 24' and the top surface and the sidewalls of gate spacers 38. In some embodiments, formation methods of dielectric layer 56 may include Molecular-Beam Deposition (MBD), Atomic Layer Deposition (ALD), PECVD, and the like.

Figure 10:
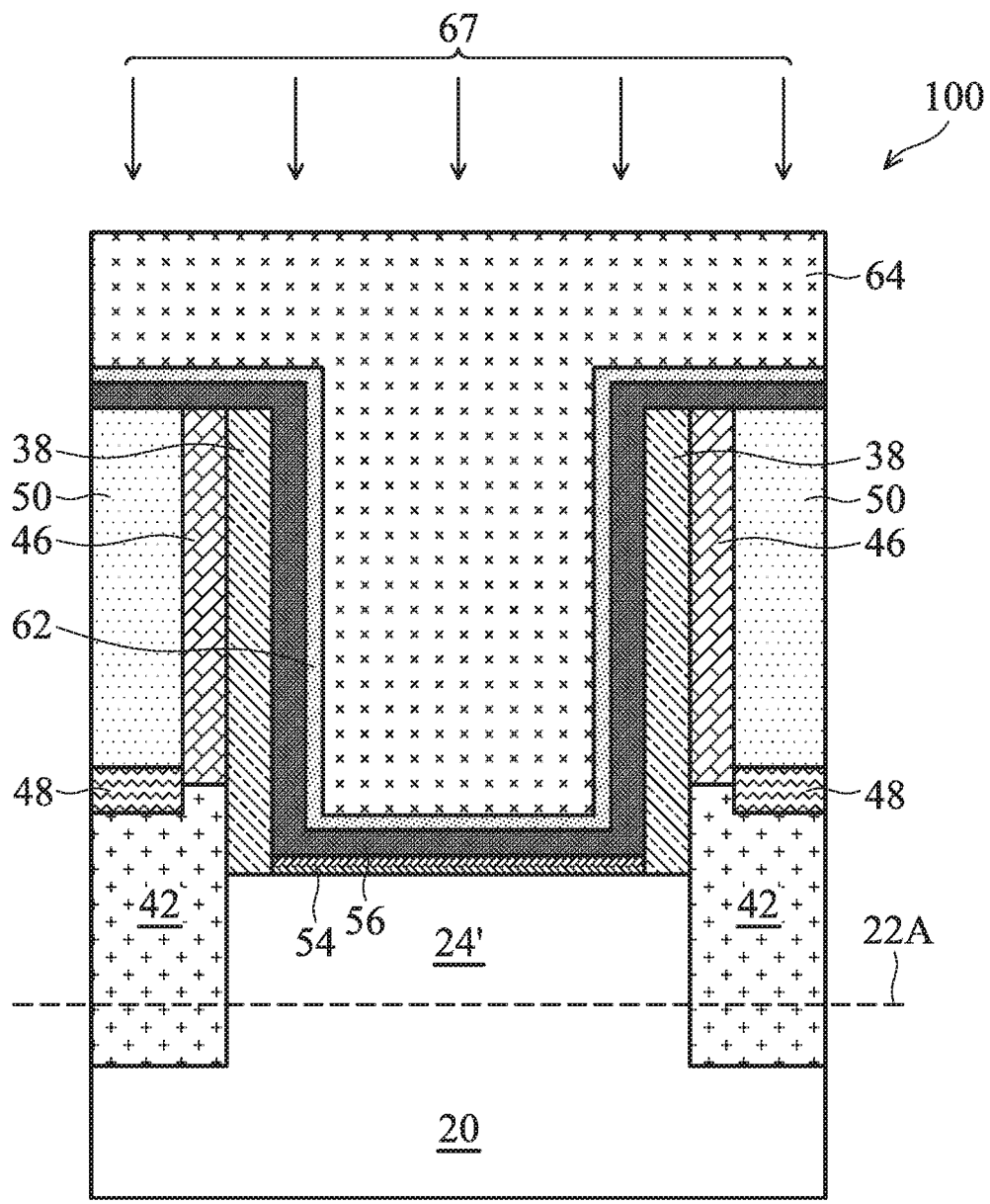

Referring to FIG. 10, capping layer 62 is formed through deposition. The deposition may be performed using a conformal deposition method such as ALD or CVD. In some embodiments, the thickness of the capping layer 62 may be between about 10 Å and about 30 Å. Capping layer 62 extends into opening 47, and some portions of capping layer 62 may extend over ILD 46. Capping layer 62 includes at least one layer, and may include a plurality of layers formed of different materials. In some cases, the specific materials of the layers in capping layer 62 may be selected according to whether the respective FinFET is an n-type FinFET or a p-type FinFET. Capping layer 62 may include one or more materials such as TiAl, TiN, TiAlN, silicon-doped TiN (TiSiN), TaN, or another material.

After the deposition of capping layer 62, sacrificial layer 64 is formed to fill the remaining portions of opening 47. In accordance with some embodiments, sacrificial layer 64 is formed of a photoresist. In accordance with alternative embodiments, sacrificial layer 64 is formed of another material that is different from the materials of the underlying dielectric layer 56 or capping layer 62. For example, sacrificial layer 64 may be formed of silicon oxide, silicon nitride, silicon carbide, or the like. Sacrificial layer 64 may have a substantially planar top surface, which may be caused by spin coating when sacrificial layer 64 is formed of a photo resist. In some cases, a planarization step such as a CMP process is performed.

Figure 11:
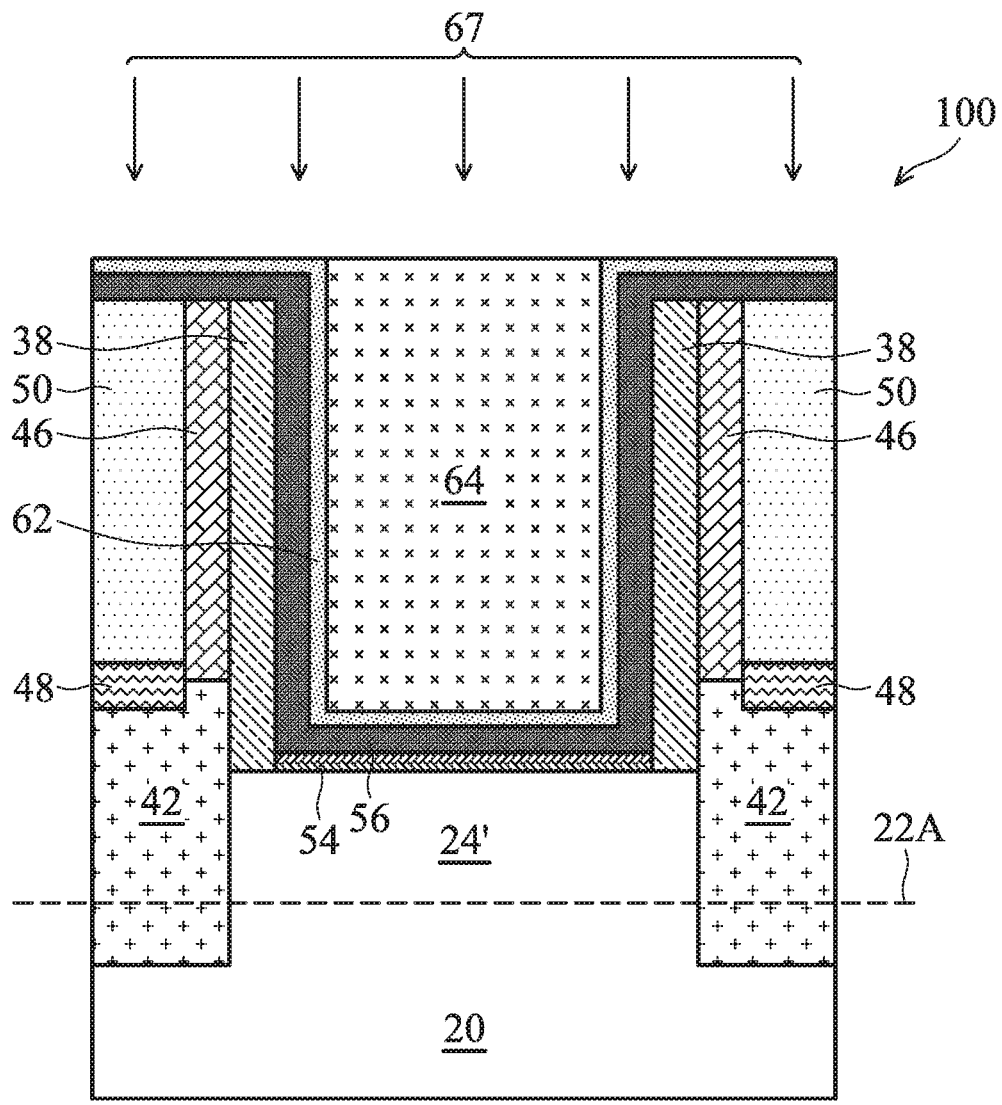

FIG. 11 illustrates the etch-back of sacrificial layer 64, which is symbolized by arrows 67. The etching may include a dry etch and/or a wet etch, and may be isotropic or anisotropic. In some embodiments, the etch-back is performed using an etchant that preferentially attacks sacrificial layer 64 and capping layer 62 over high-k dielectric layer 56.

Figure 12:
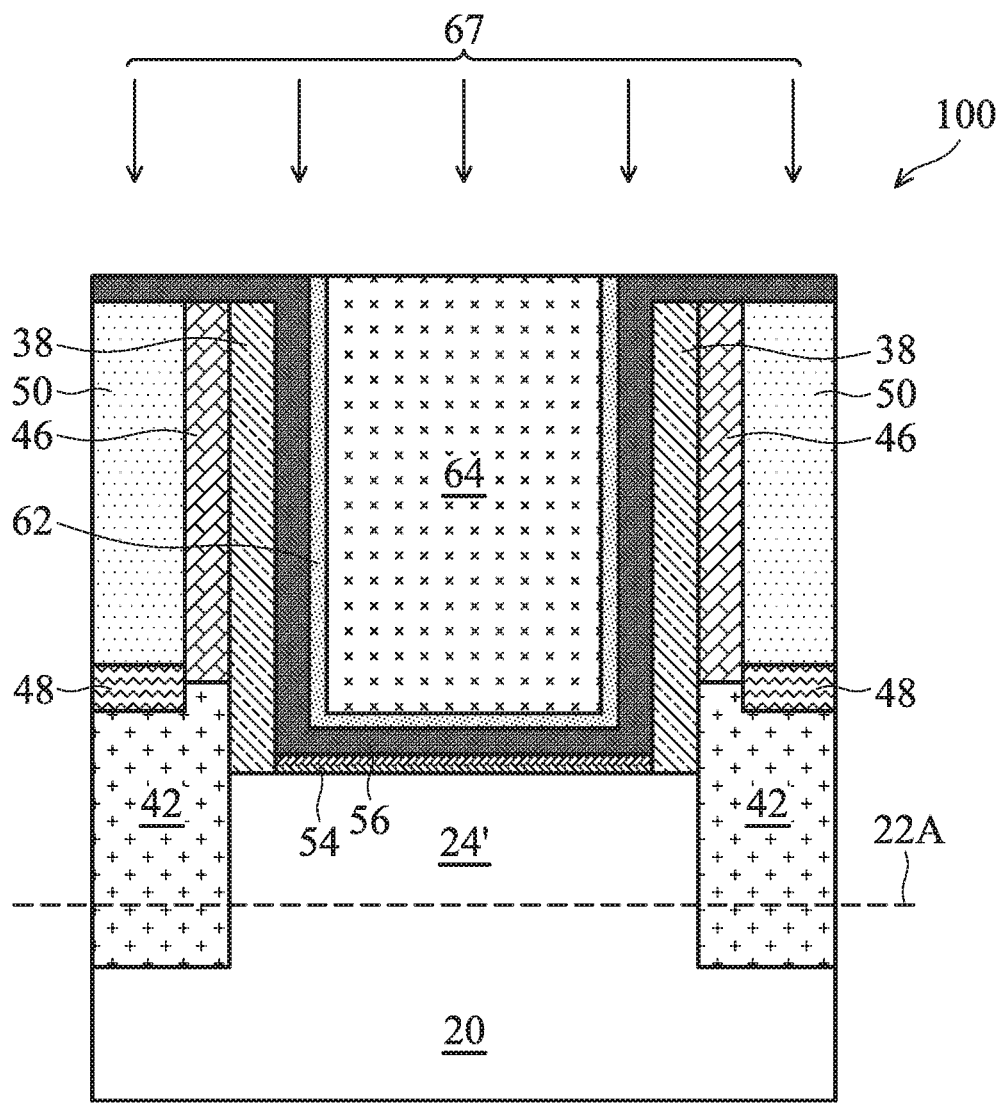

FIG. 11 illustrates an intermediate step of the etching, wherein sacrificial layer 64 is etched back, and hence capping layer 62 is exposed. Next, as shown in FIG. 12, the etch-back is continued, during which, both sacrificial layer 64 capping layer 62 are etched. As a result, high-k dielectric layer 56 is exposed. In some embodiments, high-k dielectric layer 56 is used as an etch stop layer for the etching, and exposed horizontal portions of high-k dielectric layer 56 are not etched or only slightly etched. High-k dielectric layer 56 can thus protect the underlying structure including gate spacers 38, ILD 46, and metal contact plugs 50.

Figure 13:
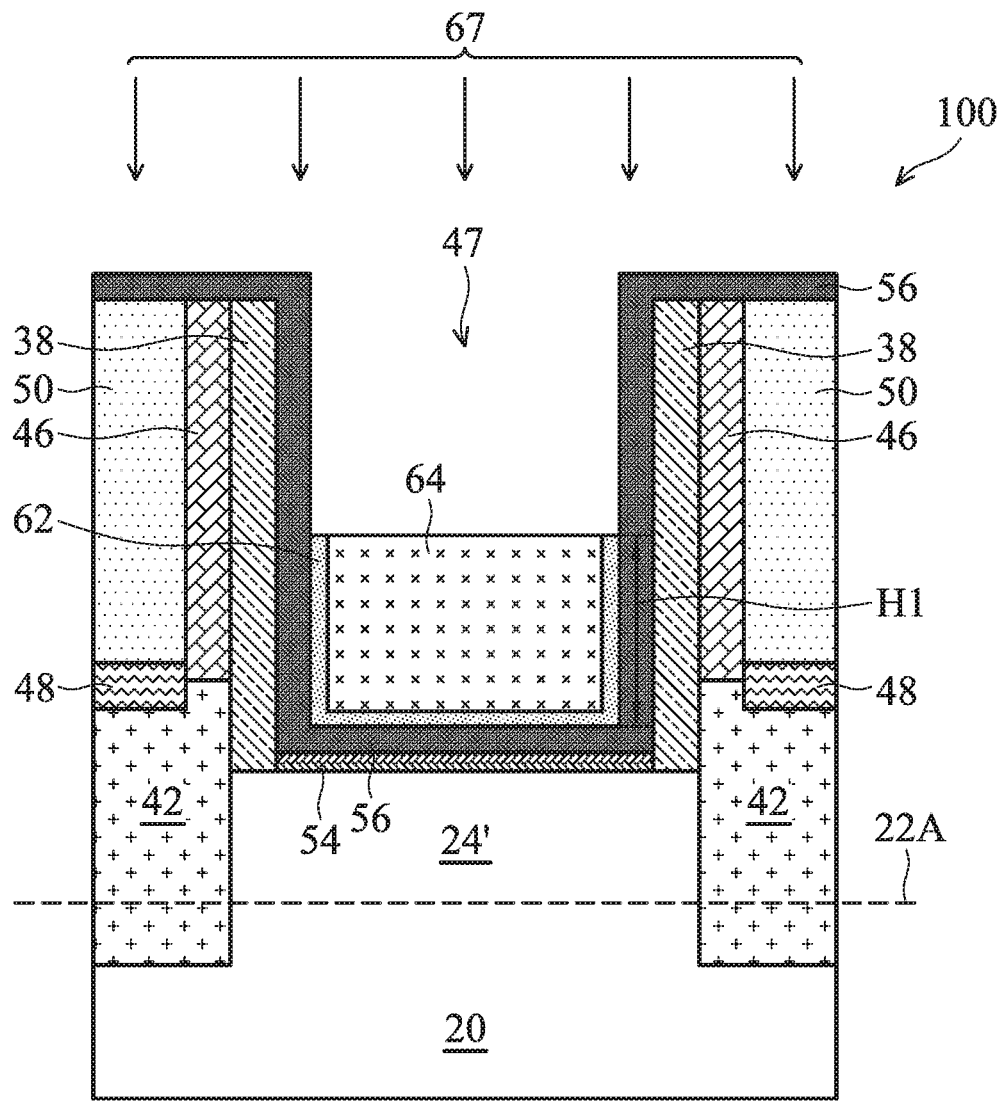

FIG. 13 illustrates a resulting structure after the etch-back is finished. Since the etchant attacks both sacrificial layer 64 and capping layer 62, during the etch-back, the top surfaces of both sacrificial layer 64 and capping layer 62 are lowered. It is appreciated that the etching rate of sacrificial layer 64 may be different from that of capping layer 62, which causes the top surface of the remaining sacrificial layer 64 to be higher than or lower than the top edges of the remaining capping layer 62. In some cases, height H1 of the remaining capping layer 62 may be in the range between about 45 Å and about 400 Å.

Figure 14:
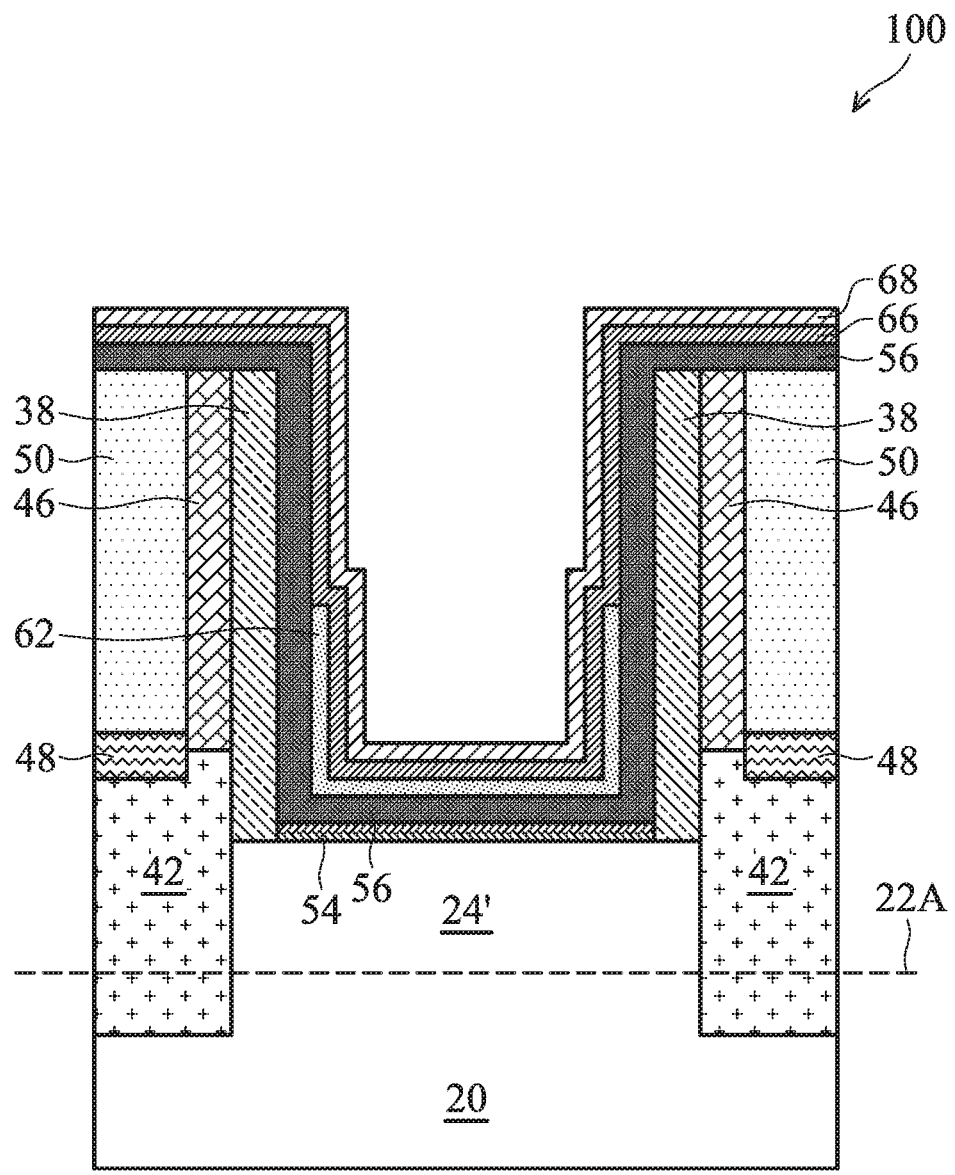

After the etch-back is finished, the remaining portion of sacrificial layer 64 is removed, for example, using a wet etch process or an ashing process, leaving remaining opening 47. Work-function layer 66 may then be formed in remaining opening 47, as shown in FIG. 14. Work-function layer 66 may be a material appropriate for the type of the respective FinFET, and its location in the metal gate can allow its work-function to affect or determine the work-function of the respective FinFET. For example, when the FinFET is an n-type FinFET, the work-function metal may have a relatively low work-function, and when the FinFET is a p-type FinFET, the work-function metal may have a relatively high work-function. In some embodiments, work-function layer 66 may include TiAl when the FinFET is an n-type FinFET, and may include TiN when the FinFET is a p-type FinFET. Other than TiAl or TiN, work-function layer 66 may include other materials in other embodiments, such as Ti, TiAlN, TaC, TaCN, TaSiN, TaN, combinations of these, or another material. In some embodiments, work-function layer 66 includes multiple layers of different materials. Work-function layer 66 may be formed using Physical Vapor Deposition, ALD, CVD, or the like. In some cases, work-function layer 66 may have a thickness between about 15 Å and about 400 Å, such as about 35 Å.

Barrier layer 68 may then be formed over work-function layer 66, as also shown in FIG. 14. Barrier layer 68 may be a material such as Ti, TiAl, TiN TiAlN, TaAlN, TaN, combinations of these, or another material. In some cases, barrier layer 68 may be a layer of TiN having a thickness between about 5 Å and about 20 Å, such as about 15 Å. In some embodiments, barrier layer 68 includes multiple layers of different materials. Barrier layer 68 may be formed using Physical Vapor Deposition, ALD, CVD, or the like.

Figure 15:
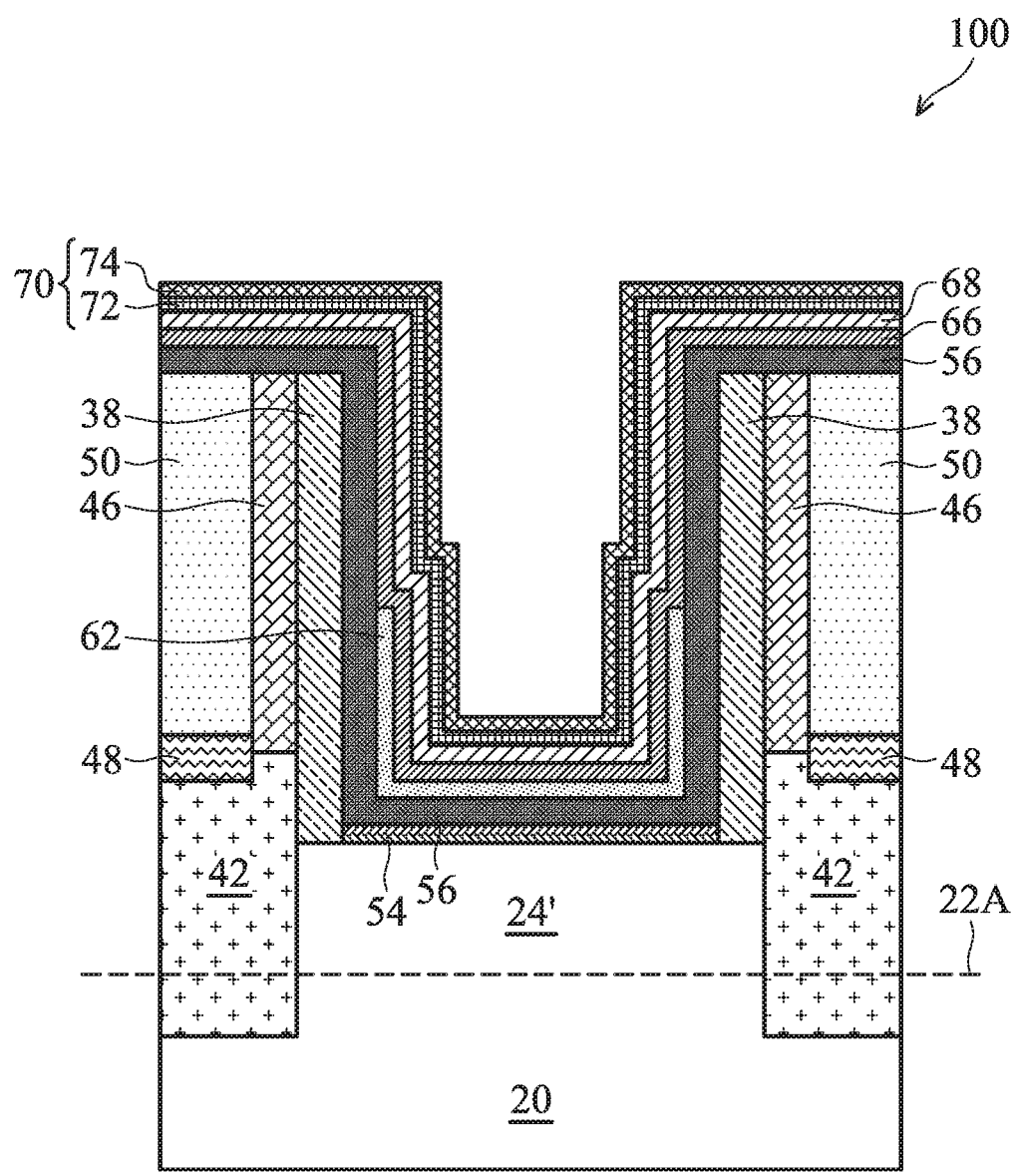

Next, seed layer 70 may be formed over barrier layer 68. Seed layer 70 can provide an improved interface between barrier layer 68 and a subsequently deposited conductive material, such as bulk metal 76. For example, seed layer 70 may provide nucleation sites for the deposition of bulk metal 76. In some embodiments, seed layer 70 includes multiple layers. As an illustrative example, FIG. 15 shows seed layer 70 including a first sublayer 72 and a second sublayer 74. The first sublayer 72 may be the same material as the second sublayer 74, which may be a conductive material such as W, Cu, Al, or another conductive material or combination of materials. In some embodiments, the first sublayer 72 may be the same material as the second sublayer 74, but with a different structure. For example, one of the first sublayer 72 or the second sublayer 74 may have an amorphous structure, and the other may have a crystalline structure.

Figure 16:
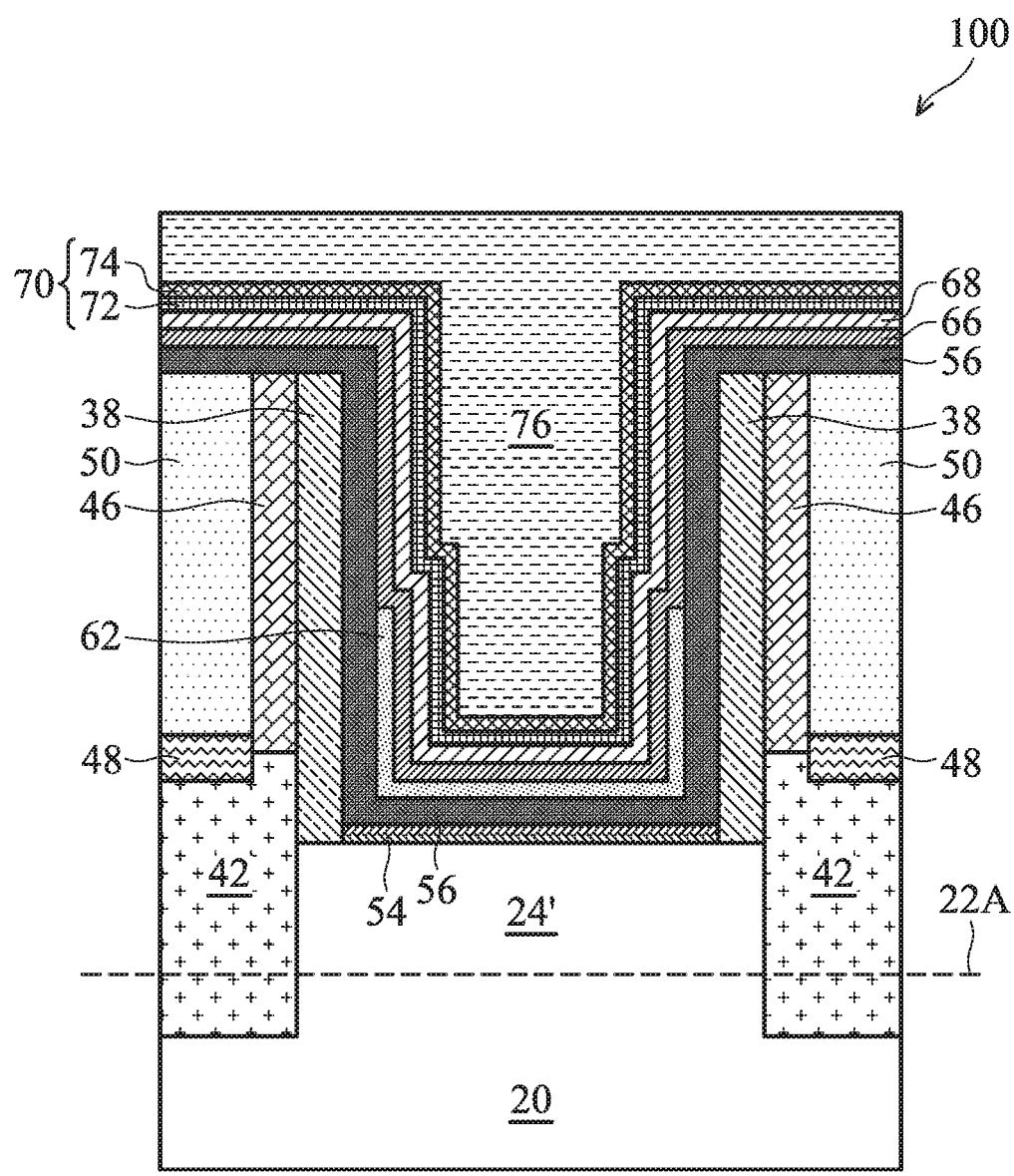

After deposition of seed layer 70, bulk metal 76 is deposited to fill the opening 47, as shown in FIG. 16. The bulk metal 76 may be W, Cu, Al, or another conductive material or combination of materials. In some embodiments, bulk metal 76 may be formed using CVD, ALD, or another method. For example, bulk metal 76 may be W and may be formed using precursor materials such as a combination of $B_2H_6$ and $WF_6$ or others.

In some embodiments, both sublayers 72, 74 of seed layer 70 may be W, and bulk metal 76 may also be W. In some embodiments, first sublayer 72 is formed as crystalline W, and second sublayer 74 is formed as amorphous W. First sublayer 72 may be formed as crystalline W, for example, by PVD, CVD, ALD, or another method. In some cases, first sublayer 72 may be formed as crystalline W using a fluorine-free precursor material, such as $WCl_5$. In other embodiments a different precursor material or combination of precursor materials may be used, such as other forms of $WCl_x$, or other materials. In some cases, first sublayer 72 as crystalline W may have a thickness between about 10 Å and about 50 Å, such as about 30 Å.

Second sublayer 74 may be formed as amorphous W, for example, by CVD, ALD, or another method. In some cases, second sublayer 74 may be formed as amorphous W using precursor materials such as a combination of $B_2H_6$ and $WF_6$, though other precursor materials may be used in other embodiments. In some cases, second sublayer 74 as amorphous W may have a thickness between about 10 Å and about 50 Å, such as about 20 Å. In some embodiments, seed layer 70 may be formed of three or more layers of alternating crystalline W and amorphous W sublayers. In some cases, seed layer 70 formed from sublayers of crystalline W and amorphous W may have a thickness between about 30 Å and about 60 Å, such as about 50 Å. In some embodiments, seed layer 70 may be formed of three or more layers of alternating crystalline W and amorphous W sublayers.

In some cases, a crystalline W first sublayer 72 can prevent fluorine (F) from penetrating into layers beneath (e.g., barrier layer 68, work-function layer 66, high-k dielectric layer 56, or other layers that may be present). For example, F may be present from one or more subsequent depositions of amorphous W (e.g., from second sublayer 74 or bulk metal 76), and crystalline W can block some or all of this F. In some cases, a seed layer formed of both a crystalline W sublayer and an amorphous W sublayer can block more F than a seed layer formed of only crystalline W or amorphous W. In some cases, using both a crystalline W sublayer and an amorphous W sublayer can reduce the concentration of F to less than about 1%.

In some cases, the presence of F can cause a threshold voltage (Vt) shift. Thus, the use of both a crystalline W sublayer and an amorphous W sublayer as described can reduce a Vt shift due to F. By reducing the Vt shift due to F, there may be more available process options for adjusting the Vt. In some embodiments, some FinFETs on a wafer may be formed using both a crystalline W sublayer and an amorphous W sublayer, and other FinFETs on the wafer may be formed using only one of a crystalline W sublayer or an amorphous W sublayer. Thus, the FinFETs having only one sublayer may have more of a Vt shift than the FinFETs having both sublayers. In this manner, the Vt of certain FinFETs on a wafer may be tuned or adjusted by varying the composition of the seed layer 70. Other characteristics of the seed layer 70 may be adjusted to change the Vt, such as the thickness of each sublayer, the number of sublayers, the process or precursors used to form each sublayer, or other characteristics.

Figure 17:
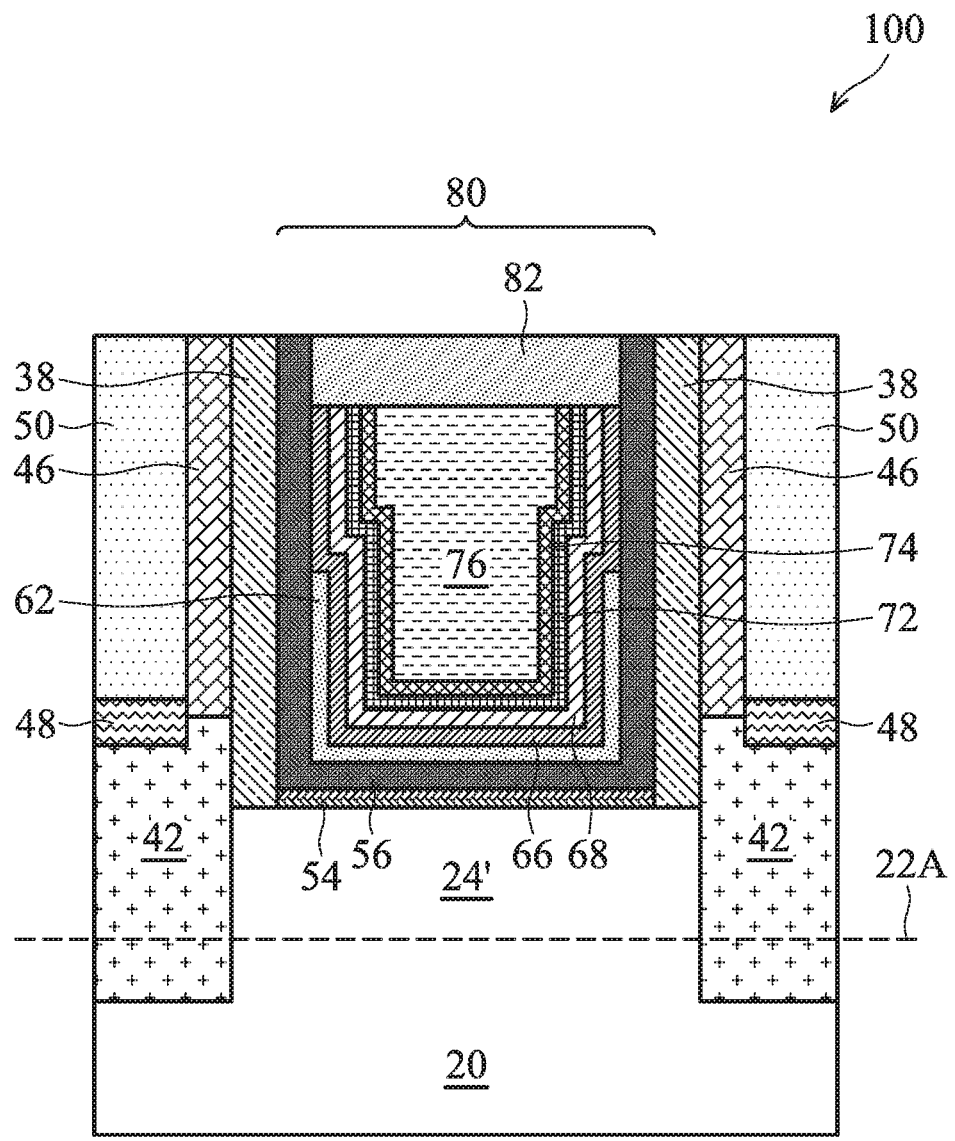

Next, a planarization process (for example, a CMP) is performed to remove portions of high-k dielectric layer 56, work-function layer 66, barrier layer 68, seed layer 70, and bulk metal 76. Horizontal portions of high-k dielectric layer 56 over ILD 46 are also removed. The remaining portions of layers 56, 62, 66, 68, 70, and 76 in combination form replacement gate stack 80. Each of the remaining portions of layers 56, 62, 66, 68, 70, and 76 includes a bottom portion and sidewall portions over and connected to the bottom portion. Next, as shown in FIG. 17, layers 66, 68, 70, and 76 are recessed, and the corresponding recess is filled with hard mask 82, which is a dielectric hard mask formed of silicon nitride, silicon oxynitride, silicon oxy-carbide, or the like. Hard mask 82 is also planarized so that its top surface is coplanar with the top surface of ILD 46. In some embodiments, seed layer 70 and/or bulk metal 76 of replacement gate stack 80 have smaller lateral widths near the bottom of replacement gate stack 80 and larger lateral widths near the top of replacement gate stack 80, as shown in FIG. 17. In some cases, seed layer 70 and bulk metal 76 can form a conductive gate structure, and an upper lateral cross-section of the conductive gate structure can have a smaller area than a lower lateral cross-section of the conductive gate structure. In some cases, seed layer 70 and/or bulk metal 76 may have a "funnel shape."

In the illustrated embodiments, source/drain contact plugs 50 are formed before the formation of replacement gate stack 80. In accordance with alternative embodiments of the present disclosure, source/drain contact plugs 50 are formed after the formation of replacement gate stack 80.

Figure 18:
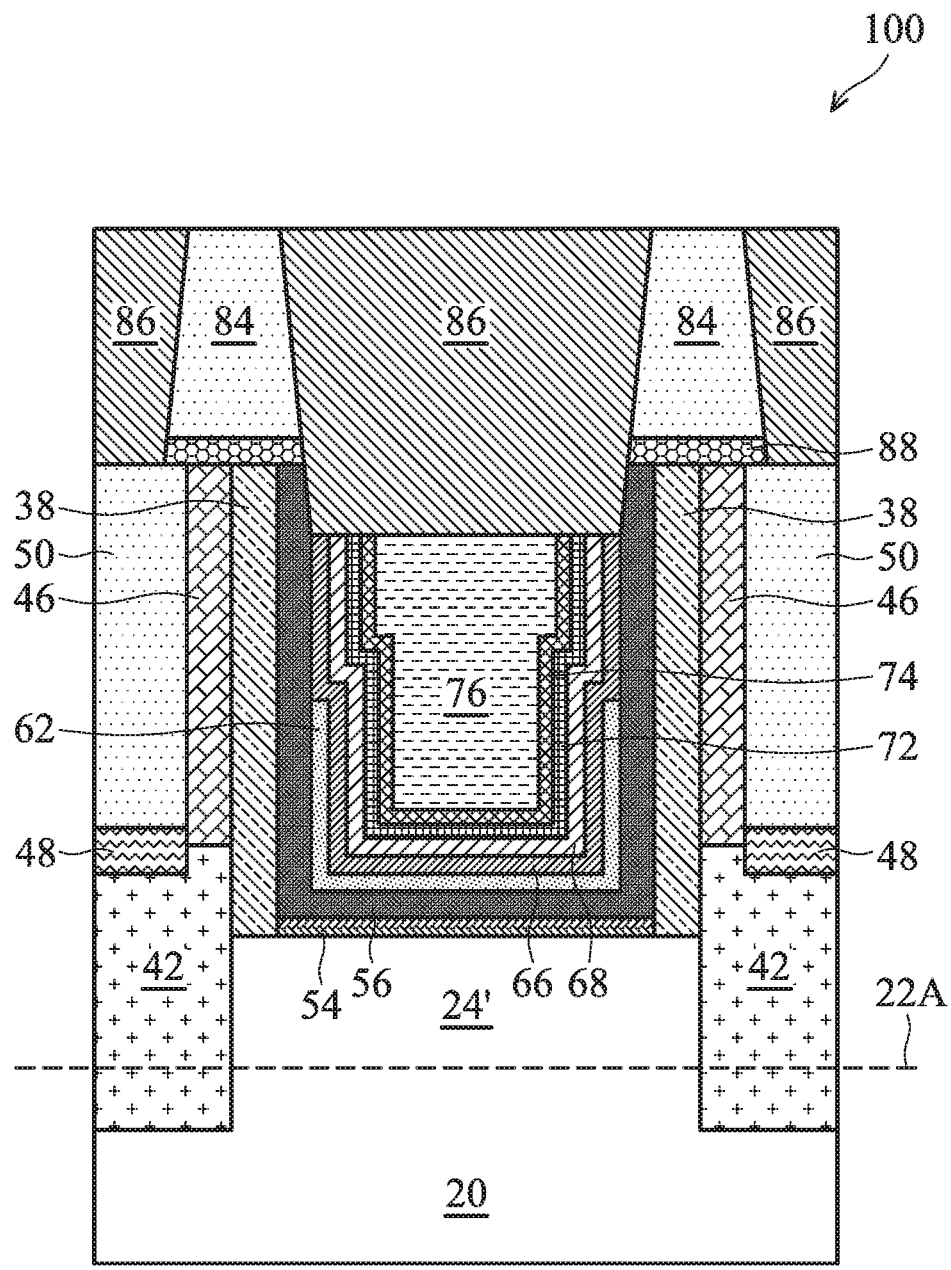

Referring to FIG. 18, etch stop layer 88 is formed over replacement gate stack 80. Etch stop layer 88 is formed of a dielectric material, which may include silicon carbide, silicon nitride, silicon oxynitride, or the like. ILD 84 is formed over Etch stop layer 88, and contact plugs 86 are formed in ILD 84. The formation process may include forming contact plug openings in ILD 84 to expose replacement gate stack 80 and source/drain contact plugs 50, and filling the contact plug openings with a conductive material to form contact plugs 86. In the illustrated plane, hard mask 82 (FIG. 17) is also removed, so that gate contact plug 86 extends into the recess left by the removed hard mask 82.

The embodiments of the present disclosure have some advantageous features. For example, by using a seed layer that has both crystalline and amorphous sublayers, the amount of fluorine present at or near the gate dielectric can be reduced, and thus Vt shifts due to the presence of fluorine can be reduced. This can allow greater flexibility of device design. Crystalline and amorphous seed layers as disclosed herein may be used in transistors other than FinFETs, such as planar MOSFETs or other types of transistors.

In accordance with some embodiments of the present disclosure, a method includes forming a first semiconductor fin protruding from a substrate and forming a gate stack over the first semiconductor fin. Forming the gate stack includes depositing a gate dielectric layer over the first semiconductor fin, depositing a first seed layer over the gate dielectric layer, depositing a second seed layer over the first seed layer, wherein the second seed layer has a different structure than the first seed layer, and depositing a conductive layer over the second seed layer, wherein the first seed layer, the second seed layer, and the conductive layer include the same conductive material. The method also includes forming source and drain regions adjacent the gate stack.

In accordance with some embodiments of the present disclosure, a method includes forming a dummy gate stack on a semiconductor region, forming gate spacers on sidewalls of the dummy gate stack, removing the dummy gate stack to form an opening, and forming a gate dielectric layer extending into the opening. The method also includes forming a seed layer over the gate dielectric layer extending into the opening, wherein forming the seed layer includes depositing a first seed sublayer using a first deposition process and depositing a second seed sublayer over the first seed sublayer using a second deposition process. The method also includes filling the remaining opening with a conductive material.

In accordance with some embodiments of the present disclosure, a device includes a gate stack disposed over a semiconductor channel region. The gate stack includes a gate dielectric material disposed over the semiconductor channel region, a seed layer disposed over the gate dielectric material, wherein the seed layer includes a plurality of sublayers, wherein at least one sublayer is crystalline and at least one sublayer is amorphous, and a conductive material disposed over the seed layer. The device also includes source/drain regions adjacent and on opposite sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a gate stack disposed over a semiconductor channel region, the gate stack comprising:
  a gate dielectric material disposed over the semiconductor channel region;
  a seed layer disposed over the gate dielectric material, wherein the seed layer comprises a plurality of sublayers, wherein at least one sublayer is crystalline and at least one sublayer is amorphous; and
  a conductive material disposed over the seed layer; and
 source/drain regions adjacent and on opposite sides of the gate stack.

2. The device of claim 1, wherein the semiconductor channel region comprises a fin, and wherein the gate stack is disposed on sidewalls and a top surface of the fin.

3. The device of claim 1, wherein the seed layer comprises a first amorphous sublayer disposed over a first crystalline sublayer.

4. The device of claim 3, wherein the seed layer comprises a second crystalline sublayer disposed over the first amorphous layer.

5. The device of claim 1, wherein the plurality of sublayers of the seed layer comprise tungsten.

6. The device of claim 1, wherein the gate stack further comprises a barrier layer disposed between the seed layer and the gate dielectric layer.

7. The device of claim 1, wherein the seed layer and the conductive material comprise a conductive gate structure, wherein a first lateral cross-section of the conductive gate structure has a smaller area than a second lateral cross-section of the conductive gate structure, wherein the second lateral cross-section is farther from the semiconductor channel region than the first lateral cross-section.

8. A device, comprising:
 a first semiconductor fin protruding from a substrate;
 a gate stack extending over the first semiconductor fin, wherein the gate stack comprises:
  a gate dielectric layer over the first semiconductor fin;
  a first seed layer over the gate dielectric layer;
  a second seed layer over the first seed layer, wherein the second seed layer has a different structure than the first seed layer; and
  a conductive layer over the second seed layer, wherein the first seed layer, the second seed layer, and the conductive layer comprise the same conductive material; and
 source and drain regions on portions of the first semiconductor fin adjacent the gate stack.

9. The device of claim 8, wherein the first seed layer has a crystalline structure and the second seed layer has an amorphous structure.

10. The device of claim 8, wherein the conductive material is tungsten.

11. The device of claim 8, wherein the gate stack further comprises a capping layer over the gate dielectric layer, wherein a top surface of the capping layer is closer to the substrate than a top surface of the gate dielectric layer.

12. The device of claim 11, wherein the first seed layer is over the capping layer, and wherein a top surface of the capping layer is closer to the substrate than a top surface of the first seed layer.

13. The device of claim 8, further comprising a second semiconductor fin protruding from the substrate, wherein the gate stack extends over the second semiconductor fin.

14. A semiconductor device, comprising:
- a fin extending over a semiconductor substrate;
- an isolation region adjacent the fin;
- a gate structure along sidewalls and over a top surface of a channel region of the fin, wherein the gate structure comprises:
  - a gate dielectric layer over the channel region;
  - a first amorphous seed layer over the gate dielectric layer;
  - a first crystalline seed layer over the gate dielectric layer; and
  - a bulk metal material over the first amorphous seed layer and over the first crystalline seed layer, wherein the bulk metal material, the first amorphous seed layer, and the first crystalline seed layer comprise the same conductive material; and
- an epitaxial region over the fin adjacent the gate structure.

15. The semiconductor device of claim 14, wherein the first amorphous seed layer is between the gate dielectric layer and the first crystalline seed layer.

16. The semiconductor device of claim 14, wherein the first crystalline seed layer has a thickness in a range between 10 Å and 50 Å.

17. The semiconductor device of claim 14, wherein the first crystalline seed layer has a thickness greater than the thickness of the first amorphous seed layer.

18. The semiconductor device of claim 14, wherein the gate structure comprises a second amorphous seed layer over the gate dielectric layer, wherein the first crystalline seed layer is between the first amorphous seed layer and the second amorphous seed layer.

19. The semiconductor device of claim 14, wherein the gate structure comprises a second crystalline seed layer over the gate dielectric layer, wherein the first amorphous seed layer is between the first crystalline seed layer and the second crystalline seed layer.

20. The semiconductor device of claim 14, wherein the conductive material is tungsten.

* * * * *